(12) United States Patent
Hsu et al.

(10) Patent No.: US 9,214,373 B2
(45) Date of Patent: Dec. 15, 2015

(54) CHUCK EXHAUST OPENINGS

(75) Inventors: Chia-Hao Hsu, Hsinchu (TW); Kipling Yeh, Pingzhen (TW); Chia-Ching Huang, Su-ao Township, Yilan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 466 days.

(21) Appl. No.: 13/569,463

(22) Filed: Aug. 8, 2012

(65) Prior Publication Data

US 2014/0042715 A1 Feb. 13, 2014

(51) Int. Cl.
*H01L 21/683* (2006.01)
*H01L 21/67* (2006.01)

(52) U.S. Cl.
CPC ...... *H01L 21/6831* (2013.01); *H01L 21/67109* (2013.01); *Y10T 137/0318* (2015.04); *Y10T 279/11* (2015.01)

(58) Field of Classification Search
CPC ...... B25B 11/005; B25B 11/007; B25B 11/00
USPC .............................................. 269/21, 903, 20
See application file for complete search history.

(56) References Cited

U.S. PATENT DOCUMENTS

| | | | | |
|---|---|---|---|---|
| 5,067,695 | A * | 11/1991 | Huddleston | 269/21 |
| 7,992,877 | B2 * | 8/2011 | Balan | 279/3 |
| 8,757,603 | B2 * | 6/2014 | Willwerth et al. | 269/21 |
| 2007/0222131 | A1* | 9/2007 | Fukumoto et al. | 269/21 |
| 2008/0169593 | A1* | 7/2008 | Shen et al. | 269/21 |
| 2010/0133735 | A1* | 6/2010 | Katsuta | 269/21 |
| 2014/0042715 | A1* | 2/2014 | Hsu et al. | 279/3 |
| 2014/0097175 | A1* | 4/2014 | Yu et al. | 219/444.1 |

* cited by examiner

*Primary Examiner* — Lee D Wilson
(74) *Attorney, Agent, or Firm* — Haynes and Boone, LLP

(57) ABSTRACT

A chuck includes a number of gas openings positioned to provide a gas flow to a backside of a wafer secured to the chuck. The chuck also includes a number of exhaust openings positioned to exhaust the gas at a distance from a topside edge of the wafer such that adverse thermal effects on the edge are reduced to a predetermined level.

20 Claims, 6 Drawing Sheets

CHUCK EXHAUST OPENINGS

BACKGROUND

The semiconductor Integrated Circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

Integrated circuits are typically formed onto a semiconductor wafer. Various photolithographic processes are used to form the individual components that make up the integrated circuit into the wafer. Such components include transistors, capacitors, and metal contacts. One type of photolithographic process used to form such components is an Extreme Ultra-Violet (EUV) lithographic process. An EUV lithographic process involves projecting electromagnetic radiation having a wavelength between 10 nanometers (nm) and 120 nm onto the wafer. At such a small wavelength, the electromagnetic radiation is absorbed by air and thus the process has to be performed in a vacuum to avoid such absorption.

When performing an EUV lithography process, a chuck is used to secure a wafer within a vacuum chamber for the duration of the process. One example of a type of chuck is an Electronic chuck (E-chuck). An E-chuck includes a charged plate that uses static electrical forces to secure the semiconductor wafer to the chuck. For example, a particular portion of the wafer may be positively charged. The corresponding plate on the E-chuck is then negatively charged. These opposite charges provide an attractive force that securely holds the wafer in place during the EUV process. In some cases, the stress from the static electrical force on the wafer may cause irregularities within the wafer. To relieve the force placed on the wafer, a gas is pumped through the E-chuck to the backside of the wafer. This gas is pressurized to provide an opposing force to the static electrical force. The opposing force is designed to be strong enough to relieve the pressure on the wafer while still allowing the wafer to be secured in place for the EUV lithographic process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
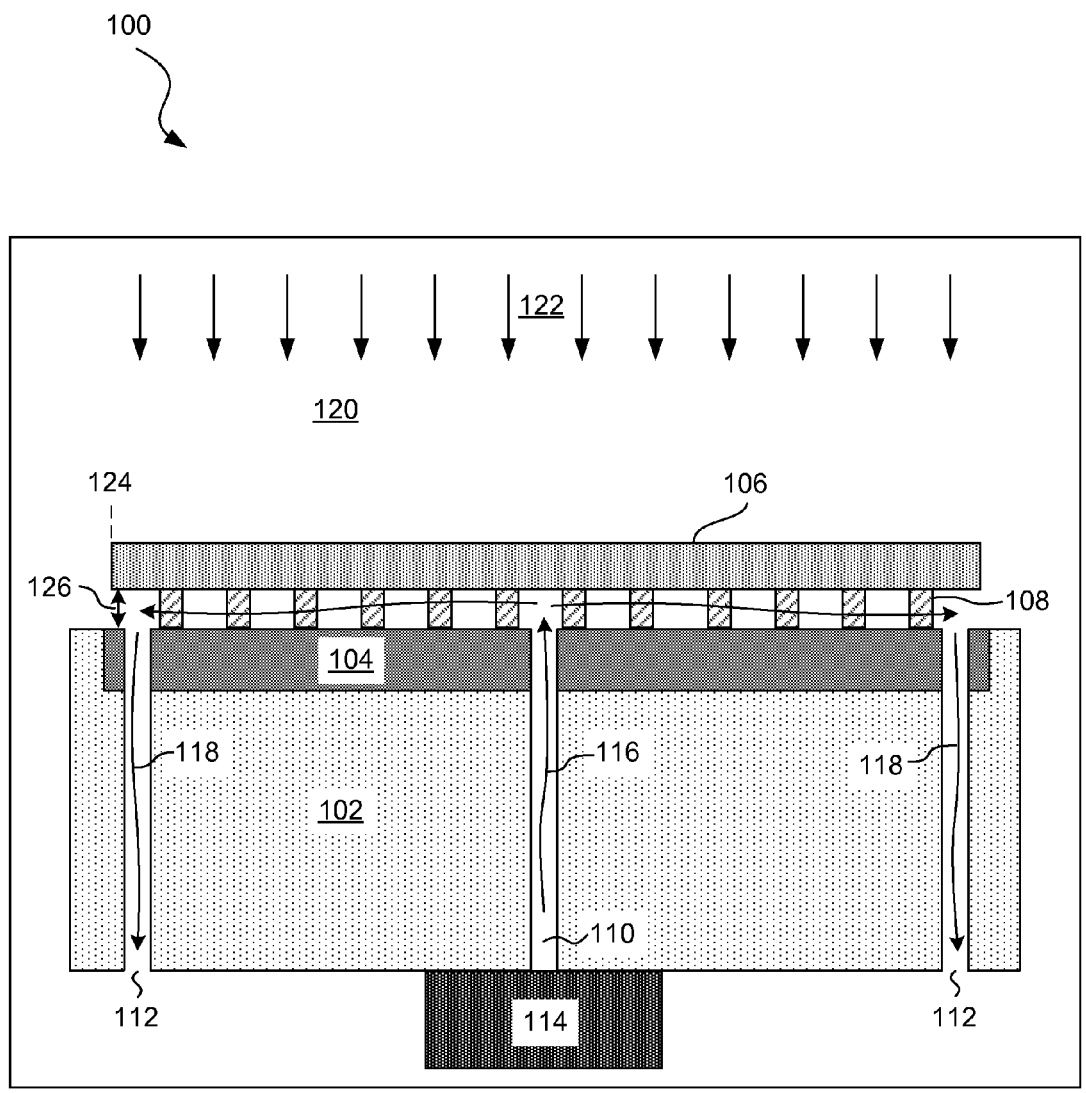
FIG. 1 is a diagram showing an illustrative cross-sectional view of a wafer mounted on a chuck with exhaust openings, according to one example of principles described herein.

The present specification discloses a chuck structure that reduces the adverse thermal effects on a wafer resulting from gas flowing along the backside of the wafer. According to certain illustrative embodiments, the chuck includes a number of gas openings positioned to provide a gas flow to a backside of a wafer secured to the chuck. The chuck also includes a number of exhaust openings positioned to exhaust the gas away from the wafer at a location other than the edge of the wafer. The exhaust openings may be designed so that gas is exhausted far enough away from the wafer edge so as to reduce the adverse thermal effects on the wafer to a tolerable level.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a diagram showing an illustrative cross-sectional view 100 of a wafer 106 mounted on a chuck 102 with exhaust openings 112. According to certain illustrative examples, the chuck 102 includes a charged plate 104, a number of support pins 108, a number of gas openings 110, a number of exhaust openings 112, and a gas pumping mechanism 114. The chuck 102, having the wafer 106 secured thereon, is placed within a vacuum chamber 120 during an EUV process 122.

A chuck 102 is typically designed to hold semiconductor wafers of a standard size. The standard wafer size may be approximately 300 millimeters (mm) in diameter. The charged plate 104 may have a slightly smaller diameter than the wafer 106. For example, the charged plate may be approximately 294.5 mm in diameter. This smaller diameter can allow for the placement of exhaust openings 112 within the chuck 102 underneath an edge 124 of the wafer 106.

The gas opening 110 is used to supply a gas to the backside of the wafer 106. The backside of the wafer 106 is the side that is opposite the side receiving the lithographic processing. The gas opening 110 may be positioned at a location that corresponds to the center of the wafer 106. In some embodiments, there may be a single gas opening 110 at or near a position that corresponds to the precise center of the circular wafer 106.

In some embodiments, there may be multiple gas openings 110 positioned near the center of the wafer 106. The diameter of the gas openings 110 depends on the total number of gas openings 110, the type of gas being pumped towards the backside of the wafer 106, and the desired pressure of the gas. In one example, the gas openings may be approximately 0.05 millimeters (mm) in diameter.

Various types of gases may be pumped by the gas pump 114 into the gas openings 110. In one example, hydrogen gas may be pumped towards the backside of the wafer 106. Any type of gas, however, that has the desired properties may be used in accordance with principles described herein. The gas is pumped at a pressure sufficient enough to relieve the stress on the wafer 106 resulting from the static electrical forces of the chuck 102 yet not strong enough to push the wafer 106 off of the chuck 102 or to move the wafer 106 during the EUV process 122.

As the gas exits the gas opening 110, it flows along the backside of the wafer 106 from the center to the edge 124 of the wafer 106. The gas thus flows between the support pins 108 towards the wafer edge 124. Without any exhaust openings 112, the gas would exit into the vacuum chamber 120 at the wafer edge 124. As the gas exits into the vacuum, it expands before being pumped out of the vacuum chamber 120. This expansion releases energy that causes adverse thermal effects if the expansion occurs near the edge of the wafer 106. Thus, the gas can be exhausted far enough away from the wafer so that the expansion of gas does not adversely affect the wafer. The adverse thermal effects can lead to irregularities in the wafer 106.

Irregularities within the wafer are particularly problematic when working with lithographic processes having a minimum feature size between 15-20 nm. Lithographic processes typically involve many patterning steps. Each of these steps requires precise alignment in order to form the desired components. The irregularities caused by the adverse thermal effects from the exhausted gas will affect various overlay matching techniques. This can cause alignment errors from process to process.

The exhaust openings 112 provide a route for the gas flowing alongside the backside of the wafer 106 to flow 118 out into the vacuum chamber 120 at a location that is far enough away from the wafer edge 124 so as to reduce any adverse thermal effects on the wafer edge 124. According to certain illustrative examples, the exhaust openings 112 are substantially perpendicular to the plane of the wafer 106.

While FIG. 1 illustrates the exhaust openings 112 at a 90 degree angle to the plane of the wafer 106, an exhaust opening 112 embodying principles described herein may be positioned at other angles. It is also noted that FIG. 1 is not necessarily drawn to scale. Particularly, the gap 126 between the wafer 106 and the chuck 102 may be relatively small compared to the width of the exhaust opening 112. Thus, a substantial portion of the gas may travel through the exhaust openings 112 while a relatively small portion of gas exits into the vacuum chamber at the wafer edge.

Through use of such exhaust openings 112, the gas flows 116 through the gas openings, along the backside of the wafer 106, and then flows 118 out the exhaust openings. Because most of the gas does not flow out near the wafer edge 124, the release of thermal energy resulting from the expansion does not have a significant adverse effect on the wafer edge 124. As will be described in further detail below, various forms of exhaust openings 112 may be used in order to reduce the amount of gas exiting into the vacuum chamber 120 at the edge 124 of the wafer 106.

Figure 2:
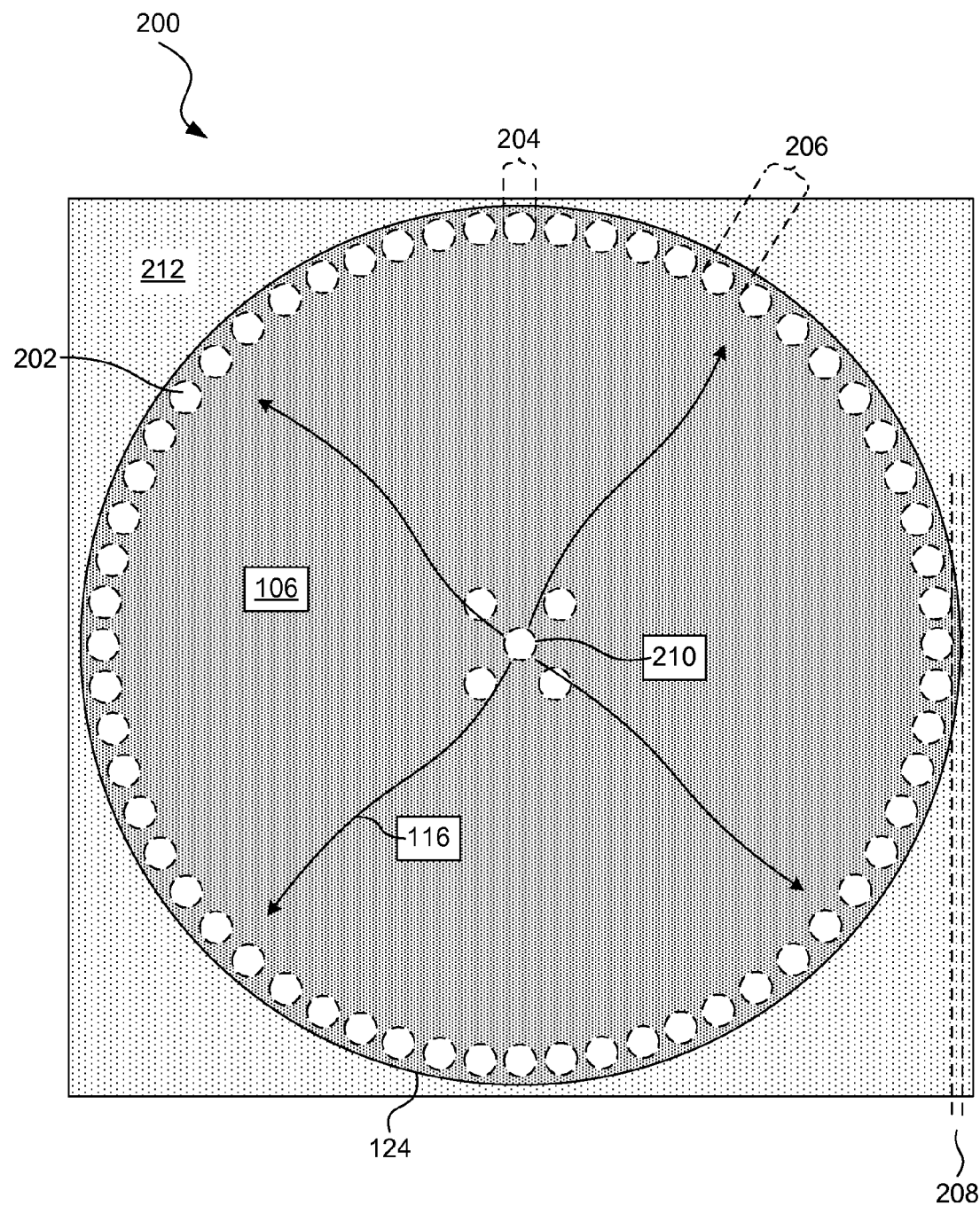
FIG. 2 is a diagram showing an illustrative top view of a wafer secured to a chuck, according to one example of principles described herein.

FIG. 2 is a diagram showing an illustrative top view 200 of a wafer 106 secured to a chuck 212. The chuck 212 is one in which the exhaust openings are holes 202. The term hole refers to an opening with a non-elongated cross section. Specifically, a hole is an opening in which the shape of the opening at the surface has an axis that is not substantially greater than a perpendicular axis. The positions of the holes 202 within the chuck 212 are shown through the wafer 106 to illustrate the position of those holes 202 with respect to the wafer 106. It is noted that the holes 202 are not formed through the wafer 106. According to certain illustrative embodiments, the exhaust holes 202 are placed in a series following a line corresponding to the edge 124 of the wafer 106.

According to certain illustrative examples, the gas openings may be a set of gas holes 210 near a position corresponding to the center of the wafer 106. The gas holes 210 may be positioned in a variety of patterns as desired in order to pump gas at the desired pressure towards a position corresponding to the center of the wafer 106. The gas then provides the desired pressure to the backside of the wafer 106 before flowing out the exhaust holes 202.

According to certain illustrative examples, the exhaust holes 202 have a diameter 204 within a range of about 0.05 mm to 0.2 mm. The exhaust holes 202 also have a pitch 206 equal to the length of the diameter 204 plus a distance within a range of about 0.05 mm to 0.5 mm. The pitch is defined as the distance between an edge of a hole and the corresponding edge of an adjacent hole. The exhaust holes 202 may be placed within the chuck 212 at a distance 208 of less than 0.1 mm from where the edge of the wafer 106 is when secured to the chuck 212. While the exhaust holes 202 illustrated in FIG. 2 have a circular shape, other hole shapes may be used in accordance with principles described herein. For example, the exhaust holes 202 may be square shaped, rectangular shaped, or any other practical shape. The characteristics of the exhaust holes 202 are selected based on the design goals of providing the appropriate pressure to the backside of the wafer 106.

Figure 3A:
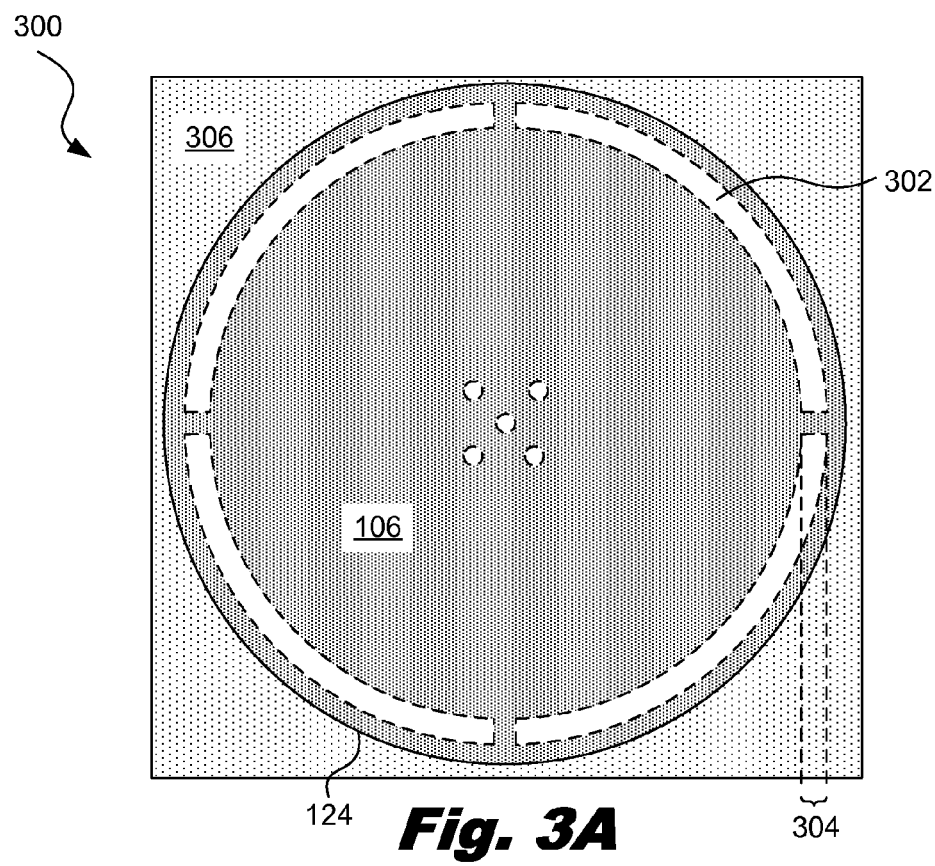
FIG. 3A is a diagram showing an illustrative top view of a wafer secured to a chuck with intermittent channels as exhaust openings, according to one example of principles described herein.

FIG. 3A is a diagram showing an illustrative top view 300 of the wafer 106 secured to a chuck 306 with intermittent channels 302 as exhaust openings. The term channel refers to an elongated opening. The channels 302 within the chuck 306 are shown through the wafer 106 to illustrate the positioning of the channels with respect to the wafer 106. It is noted that the channels are not formed through the wafer 106.

According to certain illustrative examples, the exhaust openings are channels 302 that follow a line corresponding to the edge 124 of the wafer 106 secured to the chuck 306. Various numbers of channels 302 may be placed around the wafer edge 124. The length of the channels 302 depends on the total number of channels 302. While four channels 302 are illustrated in FIG. 3A, other total numbers of channels 302 may be used in accordance with principles described herein. For example, there may be a total number of 6, 8 12, 16, 20, 24 or 32 intermittent channels 302.

The channels 302 may have a width 304 within a range of about 0.05 mm and 1 mm. The outer edge of the channels 302 may be placed within 1 mm of a line corresponding to the edge 124 of the wafer 106 secured to the chuck 306. The characteristics of the channels 302 are selected according to particular design goals of providing the appropriate pressure to the backside of the wafer 106 and exhausting gas far enough away to keep the thermal effect on the wafer edge 124 at a tolerable level.

A tolerable level is one that reduces the amount of irregularities caused by the thermal effects so as to reduce the chances of alignment errors to an acceptable level. The acceptable level for chances of alignment errors may vary according to production goals. For example, it may be determined that for a 20 mm node lithography process, the thermal effects will have to be reduced to a certain amount to avoid alignment errors caused by those thermal effects. The dimensions and positions of the exhaust openings can be designed to reduce the adverse thermal effects to a desired level.

Figure 3B:
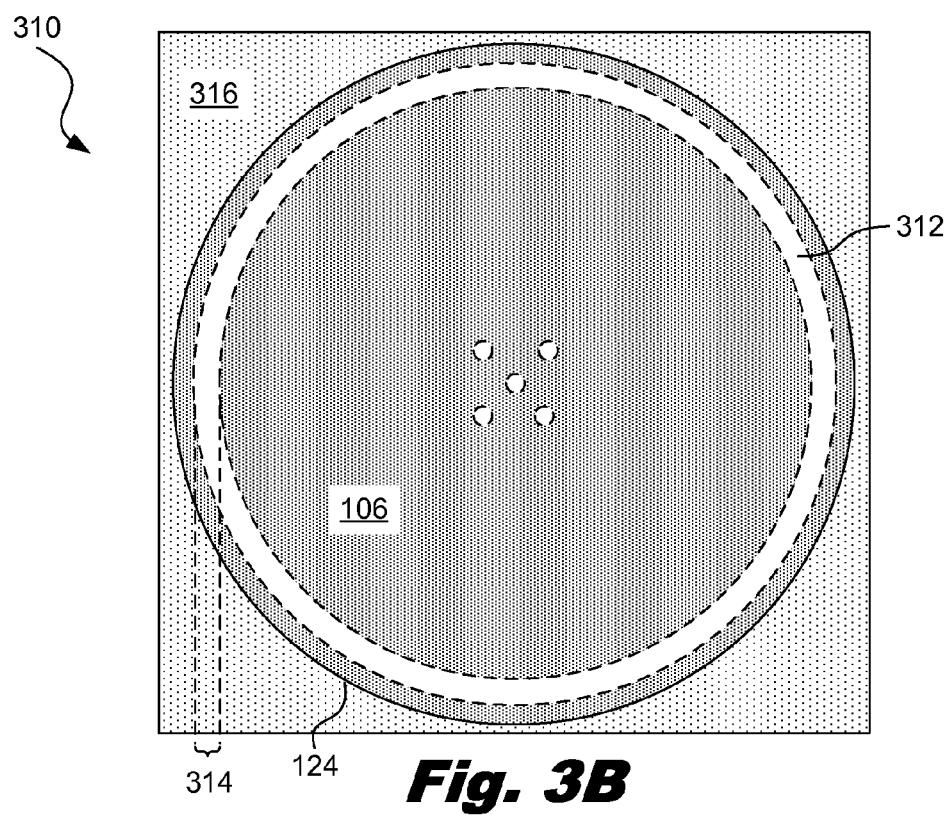
FIG. 3B is a diagram showing an illustrative top view of a wafer secured to a chuck with a continuous channel as an exhaust opening, according to one example of principles described herein.

FIG. 3B is a diagram showing an illustrative top view 310 of a wafer 106 secured to a chuck 316 with a continuous channel 312 as an exhaust opening. The channel within the chuck 316 is shown through the wafer 106 to illustrate the positioning of the channel with respect to the wafer 106. It is noted that the channel is not formed through the wafer 106.

According to certain illustrative examples, the exhaust opening is a single continuous, circuitous channel 312 that follows a line corresponding to the edge 124 of the wafer 106 secured to the chuck 316. Depending on the structure of the chuck 316, various support structures within the continuous channel 312 may be used to connect the portion of the chuck 316 on the outer side of the channel 312 to the portion of the chuck 316 on the inner side of the channel 312. The dimensions and positioning of the continuous channel 312 may vary according to different embodiments.

In one embodiment, the continuous channel 312 may have a width 314 within a range of 0.05 mm and 1 mm. The outer edge of the continuous channel 302 may be placed within 1 mm of a line corresponding to the edge of the wafer 106 when the wafer is secured to the chuck 316. The characteristics of the continuous channel 302 are selected according to particular design goals of providing the appropriate pressure to the backside of the wafer 106 and exhausting gas far enough away to keep the thermal effect on the wafer edge at a tolerable level.

Figure 4:
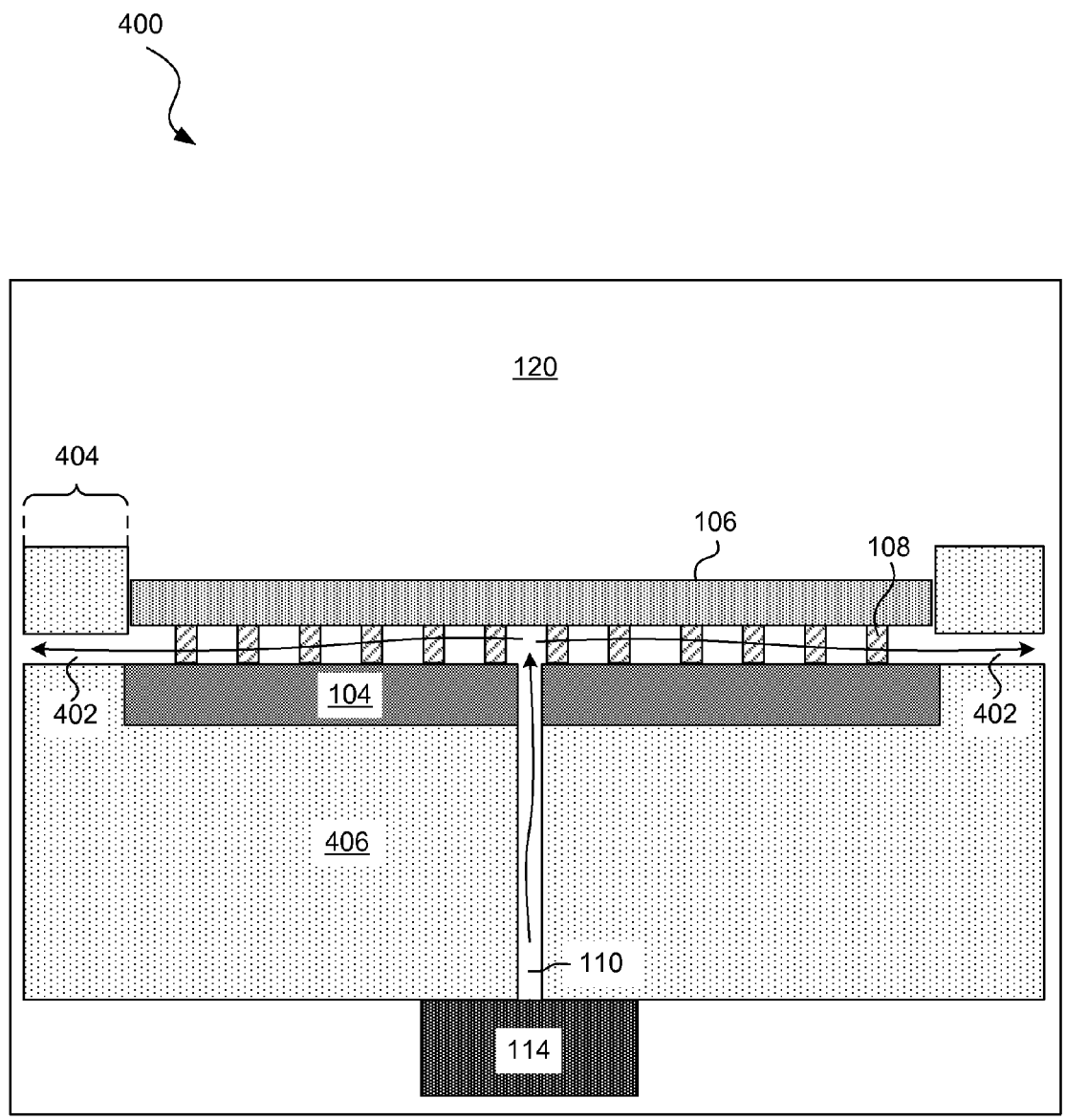
FIG. 4 is a diagram showing an illustrative cross-sectional view of a wafer mounted on a chuck with side exhaust openings, according to one example of principles described herein.

FIG. 4 is a diagram showing an illustrative cross-sectional view 400 of a wafer 106 mounted on a chuck 406 having side exhaust openings 402. According to certain illustrative examples, the exhaust openings 402 are positioned substantially parallel to the plane of the wafer 106. In such cases, the wafer 106 fits within a small recession within the chuck 406 such that the backside of the wafer 106 is below the portion of the chuck 406 beyond the circumference of the wafer 106.

As mentioned above, a gas is pumped by the gas pump 114 into the gas opening 110. The gas then flows along the backside of the wafer 106 towards the edge of the wafer 106. Upon reaching the edge of the wafer 106, the gas continues flowing through the side exhaust openings 402 until it exits into the vacuum chamber 120. The length 404 of the side exhaust openings 402 is such that the gas exits the openings 402 far enough away from the edge of the wafer 106 so as to reduce the thermal effect on that edge.

Figure 5A:
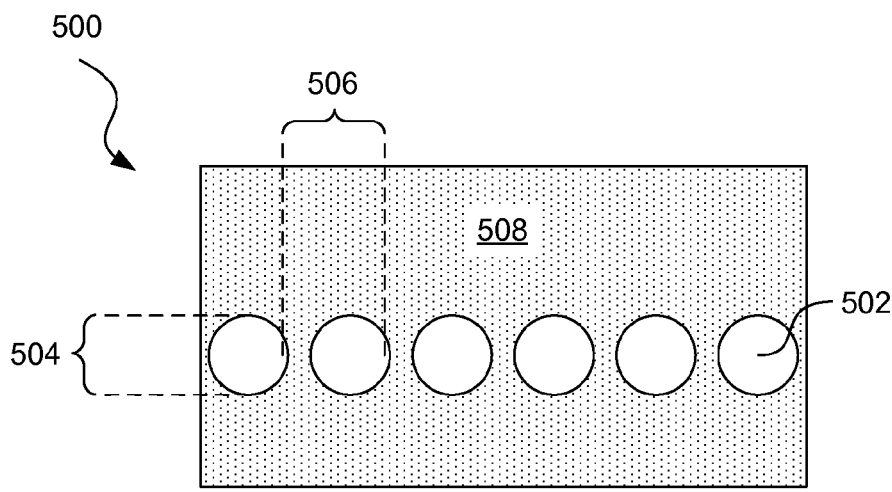
FIG. 5A is a diagram showing an illustrative cross-sectional view of side exhaust holes, according to one example of principles described herein.

FIG. 5A is a diagram showing an illustrative cross-sectional view 500 of side exhaust holes 502. According to certain illustrative examples, the side exhaust openings include a series of exhaust holes 502 positioned around the circumference of the chuck 508. The length of the side exhaust holes 502 extends between the edge of where the wafer is located when secured to the chuck 508 and the outer circumference of the chuck 508. The dimensions and positioning of the side exhaust holes 502 may vary according to different embodiments.

In one embodiment, the side exhaust holes 502 may have a diameter 504 within a range of about 0.05 mm to 1 mm. Additionally, the pitch 506 of the side exhaust holes 502 may be equal to the length of the diameter plus a distance within a range of 0.05 mm and 0.5 mm. The characteristics of the side exhaust holes 502 are selected according to particular design goals of providing the appropriate pressure to the backside of the wafer and exhausting gas far enough away to keep the thermal effect on the wafer edge 124 at a tolerable level.

Figure 5B:
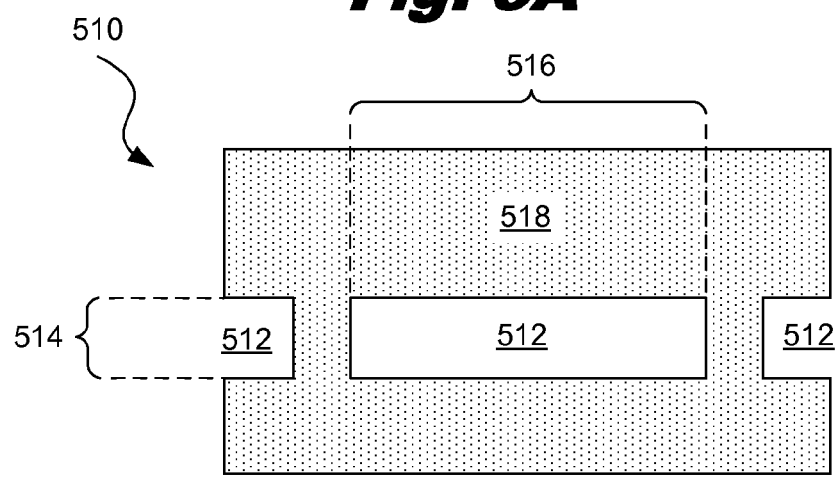
FIG. 5B is a diagram showing an illustrative cross-sectional view of side exhaust channels, according to one example of principles described herein.

FIG. 5B is a diagram showing an illustrative cross-sectional view 510 of side exhaust channels. According to certain illustrative examples, the side exhaust openings include a series of side channels 512 positioned intermittently around the circumference of the chuck 518. The length of the side channels 512 extends between the edge of where the wafer is located when secured to the chuck 518 and the outer circumference of the chuck 518. The dimensions and positioning of the side channels 512 may vary according to different embodiments.

In one embodiment, the side channels 512 may have a height 514 within a range of 0.05 mm to 1 mm. Additionally, the width 516 of the side channels 512 may vary depending on the total number of side channels 512. For example, there may be a total number of 6, 8 12, 16, 20, 24 or 32 side channels 512. The characteristics of the side channels 512 are selected according to particular design goals of providing the appropriate pressure to the backside of the wafer and exhausting gas far enough away to keep the thermal effect on the wafer edge at a tolerable level.

Figure 5C:
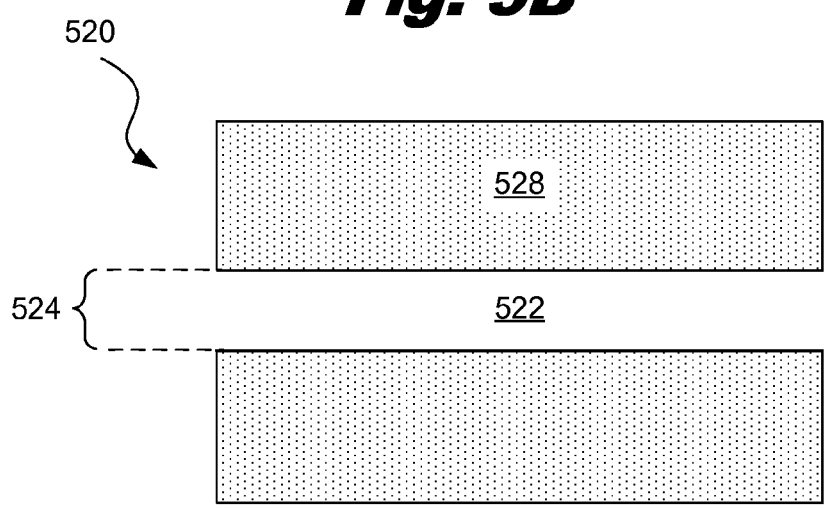
FIG. 5C is a diagram showing an illustrative cross-sectional view of a continuous side channel, according to one example of principles described herein.

FIG. 5C is a diagram showing an illustrative cross-sectional view 520 of a continuous side channel. According to certain illustrative examples, the exhaust opening is a single continuous, circuitous channel 522 that follows the circumference of the chuck 528. The length of the continuous channel 522 extends between the edge of where the wafer is located when secured to the chuck 528 and the outer circumference of the chuck 528. The dimensions and positioning of the continuous channel 312 may vary according to different embodiments.

In one embodiment, the continuous channel 522 may have a width 524 within a range of 0.05 mm and 1 mm. Depending on the structure of the chuck 528, various support structures within the continuous channel 522 may be used to connect the upper portion of the chuck 528 above the continuous channel 522 to the lower portion of the chuck 528 below the continuous channel 522. The characteristics of the continuous channel 302 are selected according to particular design goals of providing the appropriate pressure to the backside of the wafer and exhausting gas far enough away to keep the thermal effect on the wafer edge at a tolerable level.

Figure 6:
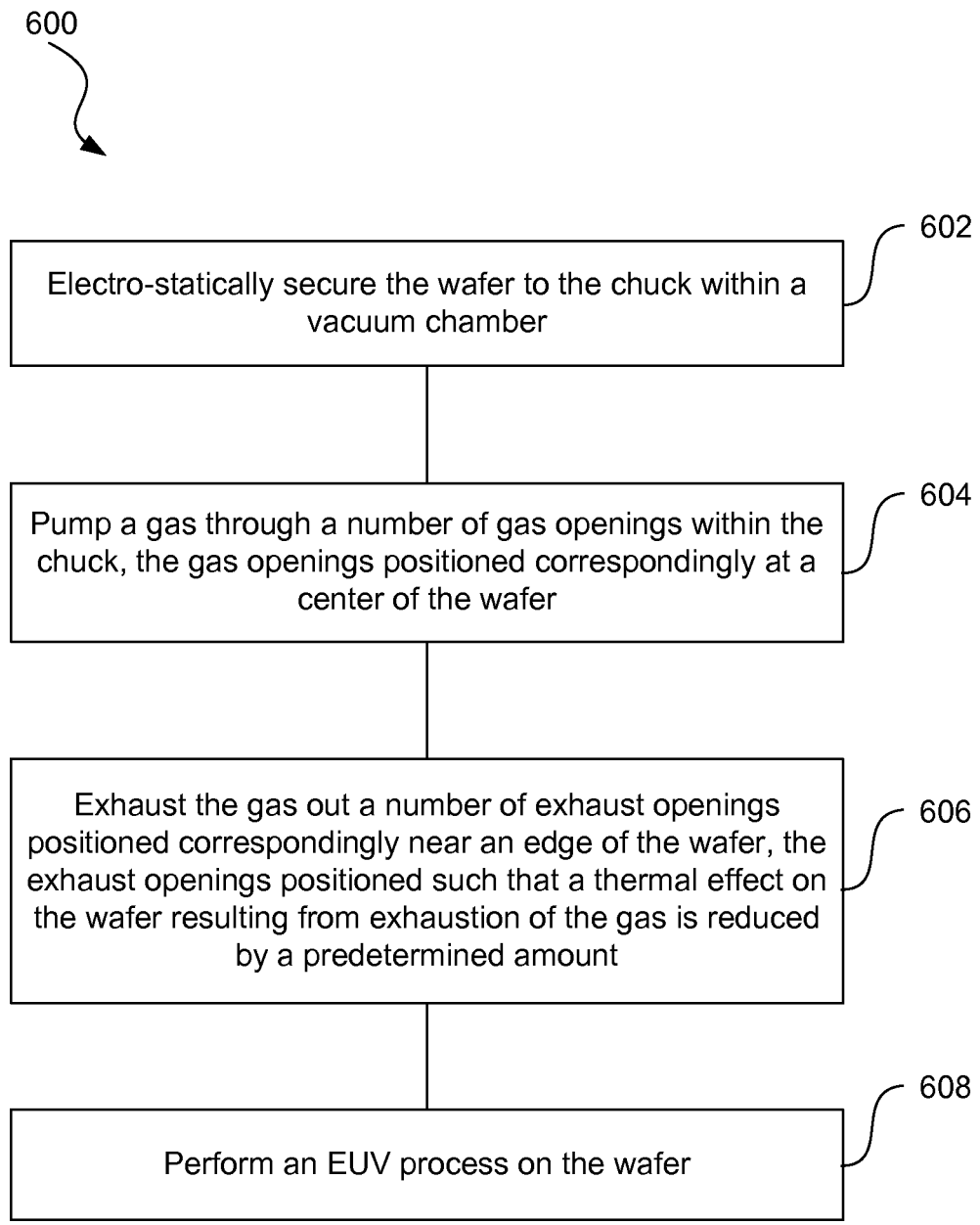
FIG. 6 is a flowchart showing an illustrative method for providing gas flow to a backside of a wafer secured to an electronic chuck, according to one example of principles described herein.

FIG. 6 is a flowchart showing an illustrative method for providing gas flow to a backside of a wafer secured to an electronic chuck. According to certain illustrative examples, the method includes electro-statically securing 602 the wafer to the chuck within a vacuum chamber. The method further includes pumping 604 a gas through a number of gas openings within the chuck, the gas openings positioned correspondingly at a center of the wafer. The method further includes exhausting 606 the gas out a number of exhaust openings positioned correspondingly near an edge of the wafer, the exhaust openings positioned such that a thermal effect on the wafer resulting from exhaustion of the gas is reduced by a predetermined amount. The method further includes performing 608 an EUV process on the wafer.

The dimensional ranges and positional ranges described within the specification are given as examples only. The examples are not intended to limit an implementation of the principles described herein to a specific range. Various dimensions and positioning outside the ranges given as an example herein may be used in accordance with the principles disclosed herein.

One of the broader forms of the present disclosure involves a chuck. The chuck includes a number of gas openings positioned to provide a gas flow to a backside of a wafer secured to the chuck. The chuck also includes a number of exhaust openings positioned to exhaust the gas at a distance from a topside edge of the wafer such that adverse thermal effects on the edge are reduced to a predetermined level.

Another one of the broader forms of the present disclosure involves a method for providing gas flow to a backside of a wafer secured to an electronic chuck. The method includes pumping a gas through a number of gas openings within the chuck, the gas openings positioned correspondingly at a center of the wafer. The method further includes exhausting the gas out a number of exhaust openings positioned correspondingly near an edge of the wafer, the exhaust openings positioned such that a thermal effect on the wafer resulting from exhaustion of the gas is reduced by a predetermined amount.

Another one of the broader forms of the present disclosure involves an electronic chuck. The electronic chuck includes a polarized plate to electronically secure a wafer to a number of support pins extending from the chuck. The electronic chuck also includes a number of openings within the chuck between a backside of the wafer and an opposing side of the chuck. A first subset of the openings is positioned underneath a center of the wafer to provide a gas flow to the backside of the wafer. Additionally, a second subset of the openings is positioned near an edge of the wafer to exhaust the gas at a distance from the wafer so as to reduce an undesired thermal effect on the wafer during an Extreme Ultra-Violet (EUV) lithography process.

The foregoing has outlined features of several embodiments so that those skilled in the art may better understand the preceding detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A chuck comprising:
an electrostatic plate for securing a wafer;
a plurality of supports extending from the plate to the wafer when secured to the chuck;
a number of gas openings positioned to provide a gas flow to a backside of the wafer; and
a number of exhaust openings disposed beyond the plurality of supports in a radial direction and positioned to exhaust the gas at a distance from a topside edge of the wafer such that adverse thermal effects on the edge are reduced to a predetermined level.

2. The chuck of claim 1, wherein the gas openings comprise a number of holes that are at a position corresponding to a center of the wafer.

3. The chuck of claim 1, wherein the exhaust openings comprise a number of exhaust holes that are at a position corresponding to an edge of the wafer.

4. The chuck of claim 3, wherein the exhaust holes are positioned within about 0.1 millimeters (mm) of the edge.

5. The chuck of claim 3, wherein the exhaust holes have a diameter within a range of about 0.05 mm to about 1 mm.

6. The chuck of claim 3, wherein the exhaust holes have a pitch of a diameter of the exhaust holes plus a distance within a range of about 0.05 mm to about 0.5 mm.

7. The chuck of claim 1, wherein the exhaust openings comprise a number of channels following a line corresponding to an edge of the wafer.

8. The chuck of claim 1, wherein the number of exhaust openings comprises a single circuitous channel following a line corresponding to an edge of the wafer.

9. The chuck of claim 1, wherein the exhaust openings are substantially perpendicular to a plane of the wafer.

10. The chuck of claim 1, wherein the exhaust openings are substantially parallel to a plane of the wafer.

11. The chuck of claim 1, wherein the exhaust openings are positioned such that a thermal effect on the wafer resulting from exhaustion of the gas is reduced to a tolerable level for a 20 nanometer (nm) node lithography process.

12. An electronic chuck comprising:
a polarized plate to electronically secure a wafer to a number of support pins extending from the chuck;
a number of openings within the chuck between a backside of the wafer and an opposing side of the chuck;
wherein a first subset of the openings positioned underneath a center of the wafer are to provide a gas flow to the backside of the wafer and a second subset of the openings positioned near an edge of the wafer are to exhaust the gas at a distance from the wafer so as to reduce an undesired thermal effect on the wafer during an Extreme Ultra-Violet (EUV) lithography process to a predetermined level, wherein the second subset of the openings are disposed closer to the edge of the wafer than any pin of the number of support pins.

13. A chuck comprising:
an electrostatic plate having a plurality of supports for contacting a retained wafer;
a plurality of gas inlets extending through the electrostatic plate and positioned near a center of the chuck; and
a plurality of gas outlets extending through the electrostatic plate and positioned near an edge of the chuck such that the electrostatic plate does not have any support for contacting the retained wafer that is radially beyond any of the plurality of gas outlets,
wherein the gas inlets and outlets are positioned such that when the wafer is on the chuck, the wafer is above the gas inlets and outlets; and
wherein the gas outlets provide a route for a gas flowing alongside a backside of the wafer to flow out into a vacuum chamber at a location that is far enough away from a wafer edge so as to reduce any adverse thermal effects on the wafer edge.

14. The chuck of claim 13, wherein the gas inlets include a connection to a high pressure gas pump.

15. The chuck of claim 13, wherein the chuck is arranged such that the gas, after coming out of the gas inlets and before entering the gas outlets, flows along the backside of the wafer between the plurality of supports.

16. The chuck of claim 13, further comprising a connection between the gas outlets and a vacuum chamber.

17. The chuck of claim 13, wherein the gas outlets are either substantially perpendicular to a plane of the wafer or substantially parallel to the plane of the wafer.

18. The chuck of claim 13, wherein the exhaust openings comprise exhaust channels that correspondingly follow an edge of the wafer.

19. The chuck of claim 13, wherein the exhaust openings comprise exhaust holes comprising at least one of: a diameter within a range of about 0.015 mm to about 1 mm, a pitch of the diameter plus a distance within a range of about 0.05 millimeters (mm) to about 0.5 mm, and a position from an edge of the wafer that is less than about 0.1 mm.

20. The electronic chuck of claim 12, wherein the second subset of the openings extend through the chuck in a direction substantially parallel to a plane of the wafer.

* * * * *